United States Patent [19]

Jindrick et al.

[11] Patent Number: 4,964,017
[45] Date of Patent: Oct. 16, 1990

[54] ADAPTABLE HOUSING FOR EMBEDDING OF COMPUTER-CONTROLLED PRODUCTS

[75] Inventors: James A. Jindrick; L. Dennis Page; Richard A. Daniel, all of Tucson, Ariz.

[73] Assignee: Intelligent Instrumentation, Inc., Tucson, Ariz.

[21] Appl. No.: 344,234

[22] Filed: Apr. 26, 1989

[51] Int. Cl.$^5$ .............................................. H05K 5/00
[52] U.S. Cl. .................................... 361/390; 361/391; 361/395
[58] Field of Search ............... 361/399, 391, 390, 392, 361/395, 424; 312/257.1, 319, 320

[56] References Cited

U.S. PATENT DOCUMENTS

| | | | |
|---|---|---|---|
| 3,547,274 | 12/1970 | Sosinkski | 211/89 |
| 3,691,432 | 9/1972 | Edfors et al. | |
| 4,236,774 | 12/1980 | Diaz | 312/351 |
| 4,296,454 | 10/1981 | Wong | 361/380 |
| 4,652,969 | 3/1987 | Stegenga | 361/384 |
| 4,672,510 | 6/1987 | Castner | 361/415 |
| 4,680,674 | 7/1987 | Moore | 361/395 |
| 4,690,286 | 9/1987 | Horne et al. | 211/41 |
| 4,700,275 | 10/1987 | Wood | 361/393 |
| 4,717,216 | 1/1988 | Hornak | 312/257 |
| 4,725,244 | 2/1988 | Chewning et al. | 361/391 |
| 4,728,160 | 3/1988 | Mondor et al. | 312/236 |
| 4,748,540 | 5/1988 | Henneberg et al. | 361/424 |
| 4,771,908 | 9/1988 | McIntosh | 220/84 |
| 4,777,565 | 10/1988 | McIntosh | 361/424 |
| 4,853,830 | 8/1989 | Corfits et al. | 361/391 |

Primary Examiner—Roy N. Envall, Jr.
Attorney, Agent, or Firm—Cahill, Sutton & Thomas

[57] ABSTRACT

An adaptable housing for a PC clone computer or the like includes easily removable front and rear panel sections and a cover, all of which are adapted to be conveniently drilled, punched, etc. for internal or external attachment of switches, connectors, and/or other user-installed equipment. A removable card cage resting on a removable base receives a variety of PC boards or other equipment in suitable slots and allows internal routing of cables, conductors, and the like from printed circuit boards mounted in the card cage to slots and/or other printed circuit boards on or connected to a horizontal mother board or back plane attached to the bottom panel of the housing. One or two boxes are attached to the front panel or the bottom panel by means of suitable brackets to carry disk drive units or other equipment. Resilient grommets mounted in suitable openings of the boxes receive heads of screws attached to side or bottom surfaces of the disk drives or other equipment to provide economical, vibration-absorbing shock mounts.

29 Claims, 5 Drawing Sheets

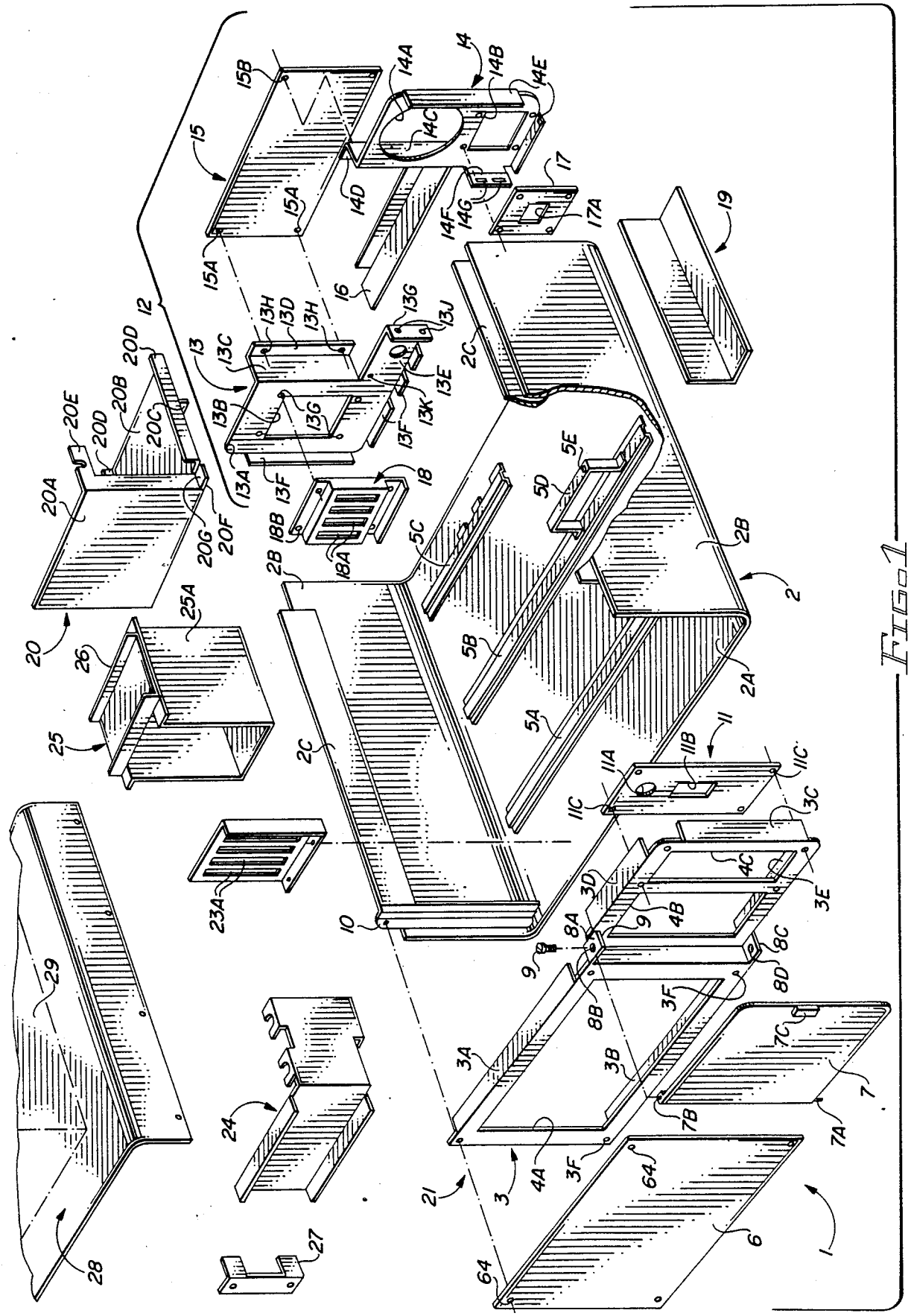

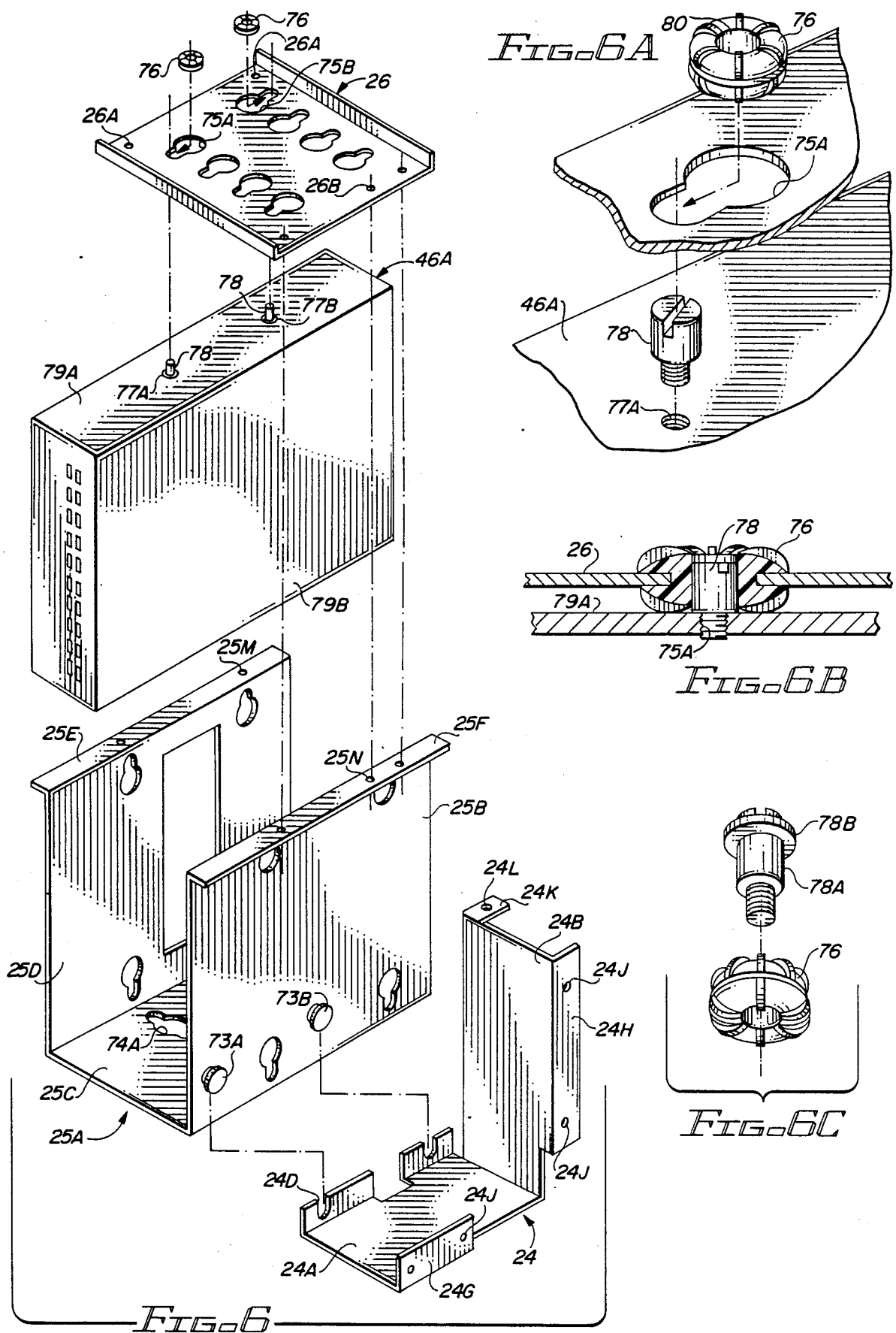

ADAPTABLE HOUSING FOR EMBEDDING OF COMPUTER-CONTROLLED PRODUCTS

BACKGROUND OF THE INVENTION

Various computers, including personal computers (PCs) have become widely used by both consumers and by industry in recent years. Numerous so-called "PC clones" are inexpensive and widely available. Powerful "minicomputers" and "super-minicomputers" have become available in desk-top housings. One segment of the computer market, especially the market for PC clones, can be referred to as the "industrial PC market". The industrial PC market makes much different use of computers than the consumer PC market, in that the consumer PC market uses purchased computers "as-is", without extensively modifying them other than by plugging in commercially available printed circuit boards into empty slots in order to enhance the computer's performance. However, the industrial PC market usually buys an IBM personal computer, a PC clone, or other computer with the intention of extensively modifying the computer and incorporating the computer into a larger product that the industrial buyer itself sells to a different market.

Unfortunately, none of the commercially available PC clones is designed to be easily modified other than by insertion of plug in printed circuit boards that enhance the computer's capability. The typical industrial PC buyer uses the computer contained in the purchased PC clone as the heart of a computer-controlled device, such as a computerized gas analyzer, a computerized heart monitor, a computerized process controller, or the like. The typical PC clone is modified by the industrial PC market buyer to contain a variety of additional plug in printed circuit boards, some or all of which may have ribbon cables, shielded cables, and/or individual conductors connected to internal connectors, extending through slots in the back of the PC clone, and running to various pieces of external equipment. In some cases, the top cover of the purchased PC clone computer is difficult to remove. It is difficult to drill or punch holes in the back panel and front panel to allow mounting of various indicators, switches, connectors, and the like, as none of the panels of present commercially available PC's is designed to be easily removed and modified by being punched, drilled, etc. Most, although not all, commercially available PC clone chassis are too wide to be mounted in a standard 19-inch equipment rack. Most commercially available PC clone chassis are not designed to withstand high levels of shock and/or vibration.

There is a presently unmet need for a housing for personal computers, for example, PC clone computers, which can be much more easily modified and used by the industrial market, especially the so-called industrial PC market. More specifically, there is an unmet need for a computer housing that makes it much easier for the industrial PC market to "embed" a PC clone computer or the like into a larger product or to "embed" additional components into the same housing as the computer to provide a computer-based new product.

SUMMARY OF THE INVENTION

Accordingly, it is an object of the invention to provide an adaptable housing for a computer that is easily modifiable to accommodate addition of cables, conductors, and equipment controlling or controlled by the computer.

It is another object of the invention to provide an adaptable computer housing which enables an industrial PC market user to reduce or eliminate the number of external cables, conductors, etc. connecting various components within the housing to each other.

It is another object of the invention to provide an adaptable PC housing in which internal components such as a card cage, power supply, and disk drives can be optionally removed or installed so as to provide flexibility in arranging available space within the housing in which to incorporate other components.

It is another object of the invention to provide an adaptable PC housing which enables a user to avoid use of certain external equipment in order to accomplish certain functions.

It is another object of the invention to provide an adaptable PC housing that can be conveniently mounted in a variety of orientations.

It is another object of the invention to provide an adaptable PC housing which provides full EMI shielding from both external sources and internal computer boards for certain internal components, including termination boards.

Briefly described, and in accordance with one embodiment thereof, the invention provides a versatile, adaptable housing for a computer such as a personal computer or PC clone, including easily removable and modifiable covers, rear panels, and front panels. A bottom section includes a bottom panel and side panels. A mother board is attached to the bottom surface of the bottom section. The mother board may include a self-contained computer, or may constitute a passive back plane into which printed circuit boards are plugged to form a computer. A front panel includes a removable, easily modifiable section that is attached to a vertical member and a lip of another front panel section to which a disk drive box containing one or more disk drives can be attached. A removable transparent window is attached to the front panel and can be opened to allow access or closed to prevent access to the disk drive(s). A rear panel includes two perpendicular extensions each having a lip to which a removable, easily modifiable rear panel can be attached by screws or the like. An industrial PC buyer can easily remove and modify the front and rear panels and also the top panel to drill/punch holes for various indicators, key pads, connectors, slots, and the like. A substantial amount of space is available above the mother board. A box containing additional equipment, such as additional hard drives, can be installed in the space, using grommets into which screw heads attached to the sides or bottoms of the disk drives or other vibration-sensitive equipment are attached to provide a vibration dampening support. A drop-in card cage fits into a removable base. A plurality of PC boards or other equipment can be inserted into slots in rails of the card cage. The top, side, front, and rear panels of the adaptable housing are suitable to have user-installed equipment attached to the inner and/or outer surfaces thereof. Internal, rather than external, cables, conductors and the like connect ends of the various termination boards to other boards and/or the mother board to allow convenient digital processing of signals from the termination boards and the like inside the housing so that the various top, front, rear, side, and bottom panels provide electromagnetic interference (EMI) shielding. Various panel mount brackets, padded feet, handles, slides, or the like are attached to the outside of panels of the housing to adapt it for attachment or resting in various orientations to supply the user's needs.

BRIEF DESCRIPTION OF THE DRAWINGS

FIG. 1 is a perspective exploded view of the adaptable housing of the present invention.

FIG. 6 is an exploded perspective view of a disk mount box and an L-shaped mounting bracket therefor.

FIG. 6A is an exploded partial perspective view illustrating a shock mount.

FIG. 6B is a partial section view of a shock mount shown in FIG. 6A.

FIG. 6C is a partial exploded perspective view of an alternate shock mount.

DESCRIPTION OF THE PREFERRED EMBODIMENTS

Figure 1A:
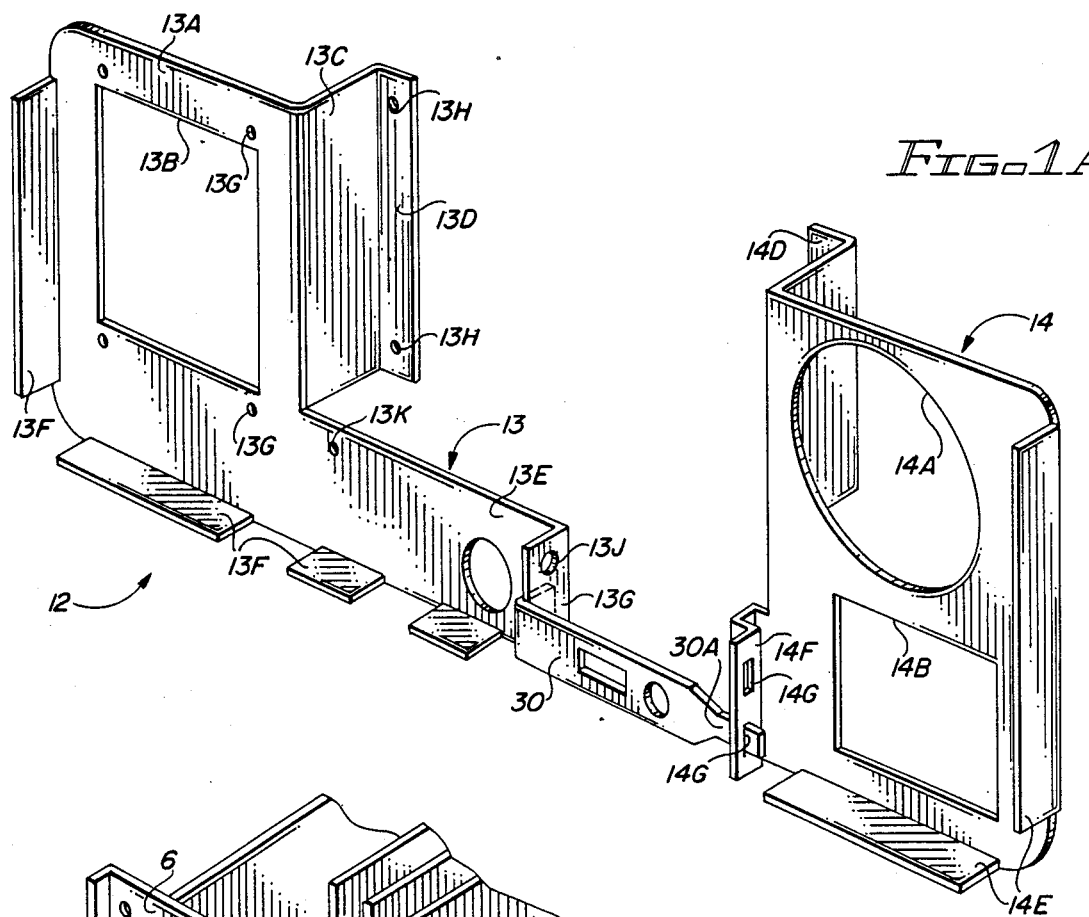
FIG. 1A is a perspective view of a back panel of the adaptable housing of FIG. 1.
Figure 3:
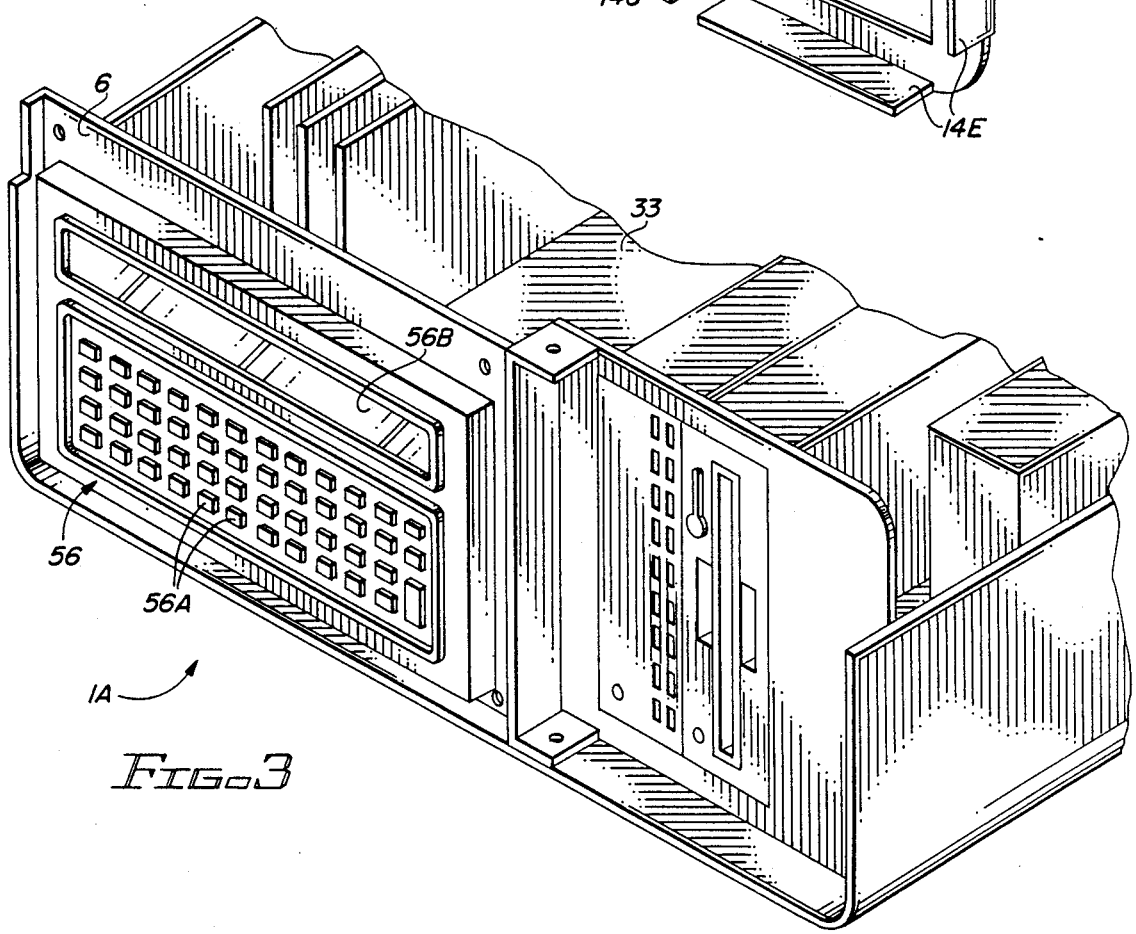
FIG. 3 is a partial front perspective view showing attachment of a keyboard/display terminal to the front panel.

Referring to FIG. 1, an exploded perspective view of adaptable housing 1 is shown without the printed circuit boards that constitute a computer. In FIGS. 2-5, numeral 1A designates the PC clone computer including the necessary printed circuit boards to form a computer.

Adaptable housing 1 includes a bottom section 2 including a bottom panel 2A and right and left side panels 2B as an integral unit composed of aluminum panel material. A pair of rectangular stiffeners 2C are attached to the inner upper edges of side panels 2B. A pair of right angle upright brackets 10 are attached to the inner front surface portions of side panels 2B. Rectangular stiffeners 5A, 5B, and 5C are attached across the inner upper surface of bottom panel 2A as shown. Stiffener 5B has a bracket 5D attached thereto for supporting a card cage pan 20. A hole 5E in bracket 5D has a captive screw fastener receptacle press fit therein.

Adaptable housing 1 includes an aluminum front panel assembly 21 including a front panel frame 3, a front face plate 6, a plastic acrylic door panel 7, and a subpanel 11. Front panel frame 3 includes a rectangular cutout opening 4A surrounded by a frame portion having four corner holes 3F therein. Right angle tabs 3A and 3B extend rearward from frame 3. The right hand portion of frame 3 is recessed approximately an inch from the plane of the front surface bounding rectangular opening 4A. The right hand portion of frame 3 includes a rectangular opening 4B for exposing the front ends of one or two disk drive units. An elongated rectangular opening 4C also is provided in the right hand portion of frame 3. Right angle tabs 3C, 3D, and 3E extend rearward from the right hand portion of frame 3 as shown. Right angle tabs 3A, 3B, 3C, 3D and 3E are used to attach frame 3 to the bottom panel 2A and side panels 2B and to provide support for the front edge of cover 28 when it is installed. An accessory 29 can be attached to the upper surface of cover 28, or even to the inner surface thereof.

Front plate 6 can be attached to frame 3 by means of screws (not shown) which extend into holes 3F and into PEM nuts that have been press fit into frame 3 or upright brace 10. Front panel 6 therefore can be easily removed and holes can be drilled or punched in it to receive a variety of connectors, indicators, microterminals, and the like which can be mounted onto front panel 6 to suit the user's needs.

A pair of horizontal tabs 8A and 8C extend to the right along the recessed right hand portion of frame 3. A screw 9 extends through clearance hole 8B and tab 8A into a hole 7B in the upper edge of acrylic door 7. A hinge pin 7A at the right hand bottom edge of door 7 extends through a hole 8D in tab 8C. A handle-latch mechanism 7C is attached to the right hand edge of door 7 to engage a meeting at latch element (not shown) on the inside front surface of right hand side panel 2B.

Subpanel 11 is attached to the inside right hand surface of frame 3 by means of four corner screws to cover rectangular opening 4C. PEM nuts (not shown) are embedded in corner holes 11C of subpanel 11 to receive screws through corresponding corner holes in frame 3 surrounding rectangular opening 4C. Various holes such as 11A and 11B can be conveniently drilled or punched by the user into subpanel 11 by simply removing it and installing suitable connectors, switches, indicators, and the like and then reinstalling subpanel 11.

An L-shaped power supply bracket 19 is bolted onto the bottom panel 2A. A variety of predrilled clearance holes (not shown) in the upright plate and upper surface of power supply bracket 19 allows a variety of different manufacturers' power supplies to be easily installed by bolting them to the upright plate of power supply bracket 19 through matching predrilled holes.

Aluminum rear panel assembly 12 of adaptable housing 1 includes a section 13 and a separate section 14. Although sections 13 and 14 could be an integral unit, they preferably are connected by one or two steel standard PC slot covers 30, as shown in FIG. 1A. Slot covers such as 30 are commercially readily available and can be predrilled or punched with suitable holes to facilitate connection of connectors, switches, and indicators that may be desired on the back panel of adaptable housing 1. Slot covers 30 each have a tongue 30A that extends through one of the slots 14G in a tab 14F of section 14. The right end of each slot cover 30 has a right angle tab with a screw hole through which a screw extends into a threaded hole such as 13J in tab 13G of section 13.

Referring back to FIG. 1, section 13 includes a rectangular opening 13B for exposing slots such as 18A of a vertical connector bracket 18. Connector bracket 18 has four PEM nuts 18B embedded therein which are aligned with four corner clearance holes 13G at the corners of rectangular opening 13B. A right angle tab 13F is oriented forward and is used to attach section 13 to left side panel 2B. Tabs 13F along the bottom of section 13 are used to attach section 13 to the inner surface of bottom panel 2A. A vertical flange or wall 13C extends rearward perpendicularly from the right edge of frame 13A, and a vertical lip 13D is attached and perpendicular to the rear edge of flange 13C, and has PEM nuts 13H embedded therein.

The right hand rear panel assembly section 14 includes a circular cutout opening 14A for installing a fan and a rectangular opening 14B having four corner clearance holes by means of which a rear subpanel 17 can be attached. Subpanel 17 typically has a cutout 17A for installation of a power connector therein. Tabs 14F mentioned above extend rearward from the left hand edge of section 14. A wall or flange 14C extends rearward from the left edge of section 14, and has connected thereto a vertical, perpendicular lip 14D having PEM nuts embedded therein. Aluminum rear face plate 15 has four corner clearance holes 15A by means of which rear face plate 15 can be easily removed and suitable openings can be punched, cut, or drilled therein and suitable connectors, switches, indicators, and the like can be installed, as indicated in FIG. 2A.

An L bracket 16 is attached to the bottom edge of rear face plate 15 to cover the gap between section 13E and slot covers 30. Suitable holes may be punched or drilled in L bracket 16 to allow convenient routing and/or connection of ribbon cables and other conductors from the inside of adaptable housing 1 to external equipment.

A vertical card guide bracket 23 can be attached to the front left portion of bottom panel 2A, as indicated by the dashed lines. Card guide 23 has a plurality of slots 23A in it, typically three. Standard plastic snap-on card guides can be snapped onto the rails between slots 23A to provide a guide for the front edges of PC boards such as 35, 36, and 37 being inserted into the mother board 33 shown in FIGS. 2-5. Such printed circuit boards typically have connectors on their opposite ends and attached slot covers which can be aligned with slots 18A in connector bracket 18 and attached thereto by suitable screws.

Card cage "pan" 20 has a horizontal bottom plate 20B with a pair of vertical opposed side members 20D and a rear downward flange 20C. A vertical panel 20A is attached to the forward edge of bottom plate 20B, and has a side member 20E performing the function of securing card cage 40. At the lower right corner of vertical plate 20, a horizontal tab 20F has a clearance hole 20G therein. Card cage pan 20 is attached to rear panel section 13 by a screw extending through a clearance hole (not shown) in tab 20C into a PEM nut 13K embedded in rear panel section 13. A captive screw extends through clearance hole 20G in tab 20F into a receptacle 5E in bracket 5D. Card cage 40 shown in FIGS. 2 and 5 fits snugly into card cage pan 20.

Disk drive box 25 is attached by means of single screw onto a hard disk bracket element 24, which is bolted to the bottom panel 2A.

Cover 28 is placed on the adaptable housing 1 when all of the printed circuit boards, front and rear panel components, disk drive units, and card cage 40 have been properly installed and the necessary conductor and cable connections have been made. Cover 28 is attached by means of clearance holes therein and screws inserted into suitable PEM nuts (not shown) embedded into rectangular stiffeners 2C. A suitable monitor and/or printer 29 can be attached to the top surface of cover 28. If desired, various electrical or mechanical components also can be attached to the bottom surface of cover 28 and extend into space that may be available inside adaptable housing 1 if one of the disk drive boxes or cage 40 is omitted, or if space is available over the mother board 33 because PC boards 35, 36, and/or 37 are not needed.

Figure 2:
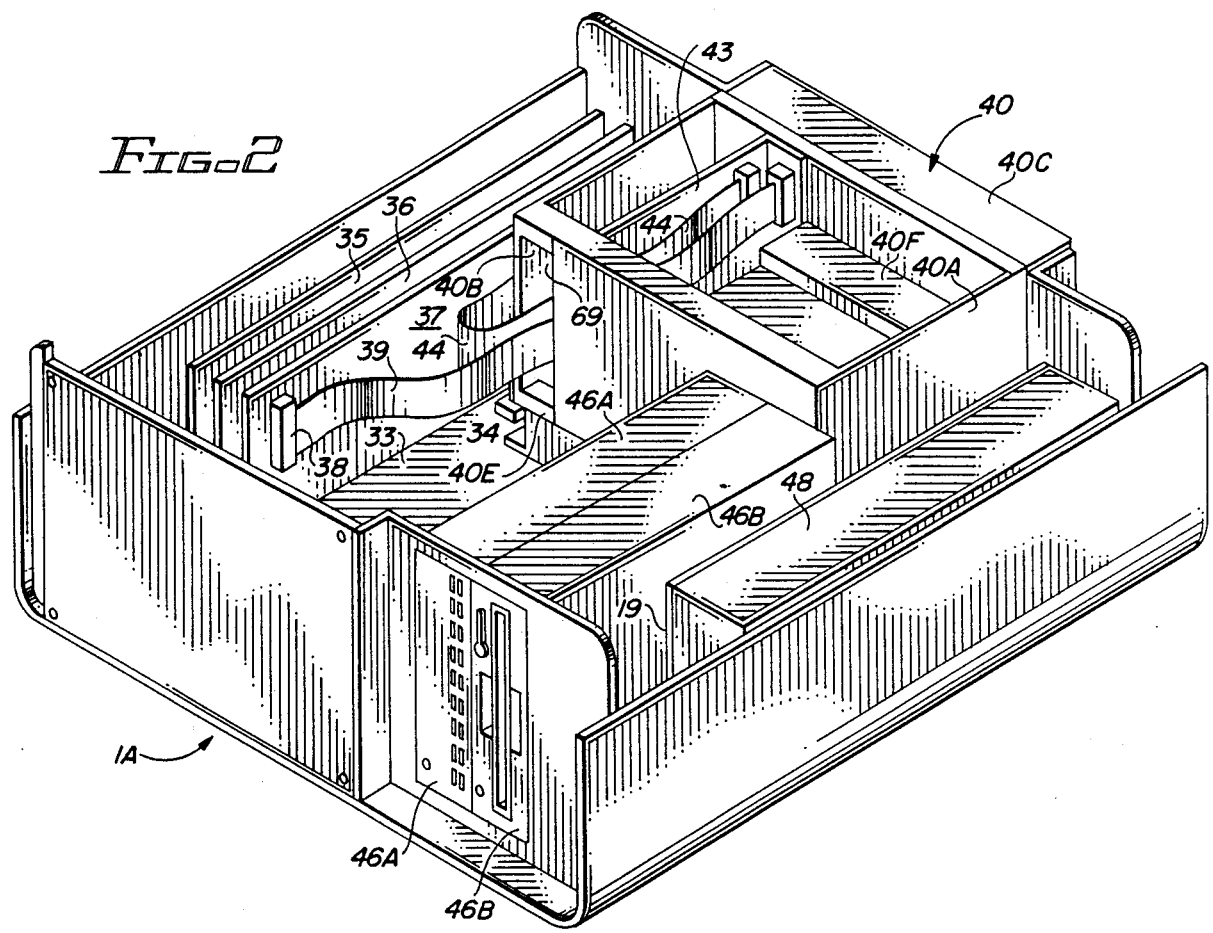
FIG. 2 is an open perspective top view of the housing of FIG. 1.
Figure 2A:
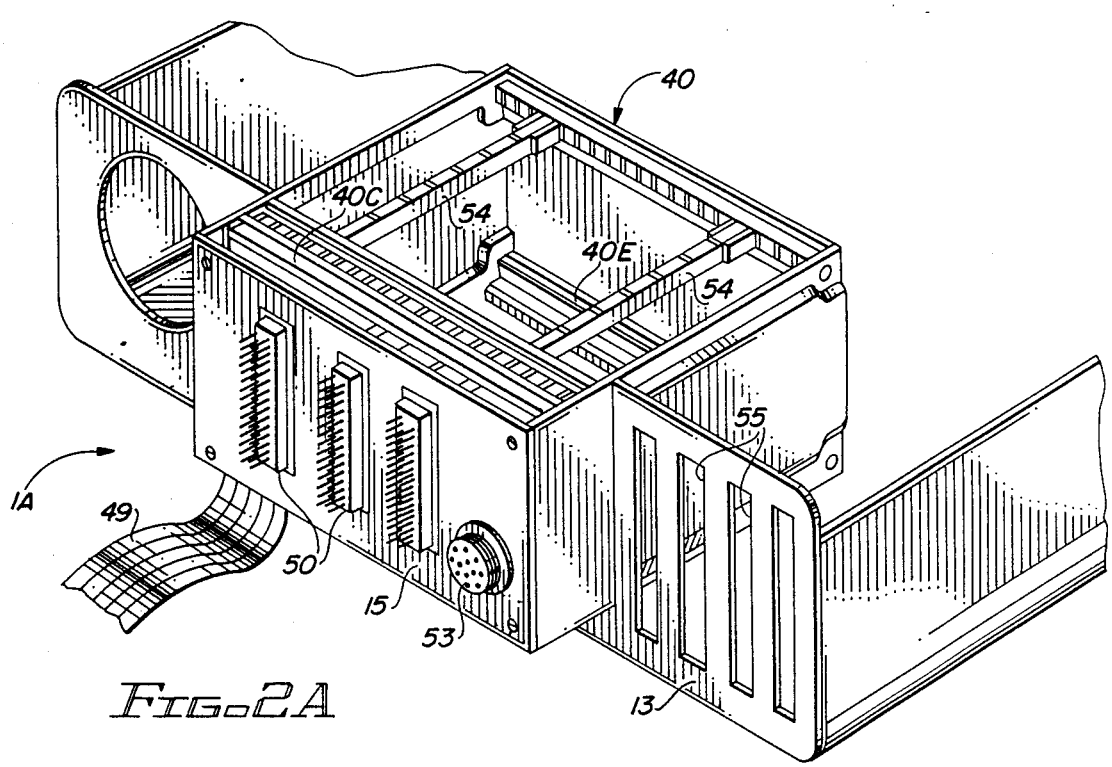
FIG. 2A is a partial perspective rear view of the adaptable housing showing various slots, connectors, switches, and cables thereon.

In accordance with the present invention, an industrial PC user purchases the complete computer IA, the inside of which may appear as shown in FIG. 2, except that the PC board 43 and the ribbon cables 39 and 44 and the printed circuit boards 35, 36, and 37 are not included. The computer 1A includes, in addition to the components shown in FIG. 1, a mother board 33 having a plurality of connectors such as 34 into which a plurality of additional printed circuit boards 35, 36, and 37 may be plugged. Computer 1A also includes a power supply 48, a hard disk drive 46A, and a floppy disk drive 46B which are supported in a disk drive box essentially identical to disk drive box 25 in FIG. 1. That box is mounted on standoffs on the bottom panel 2A.

The industrial PC user then removes the cover 28 and various panels such as front face plate 6 and rear face plate 15 and L-bracket 16 and subpanel 11 to modify them as needed to either embed computer 1A into a larger product or embed other pieces of equipment onto or into the adaptable housing 1. For example, various holes can be cut, punched, or drilled in front face plate 6 to facilitate connection of cables, indicators, switches, controls, etc. which then are mounted thereon. As another example, a microterminal, such as a TM-8500 manufactured by Burr-Brown Corporation and designated by numeral 56 in FIG. 3, can be attached to front plate 6 as shown. This microterminal 56 includes a complete keyboard 56A and an LCD display 56B. Terminal connectors can be fed through appropriate holes in front plate 6 to suitable connectors on mother board 33, printed circuit boards plugged into the mother board 3, or printed circuit boards plugged into card cage 40.

Mother board 33 can be a model WD286-WDM20, manufactured by Western Digital Corporation, which contains a complete computer that is compatible with an IBM AT personal computer. It has four slots or connectors into which additional printed circuit boards such as 35, 36, and 37 can be plugged if needed.

Figure 4:
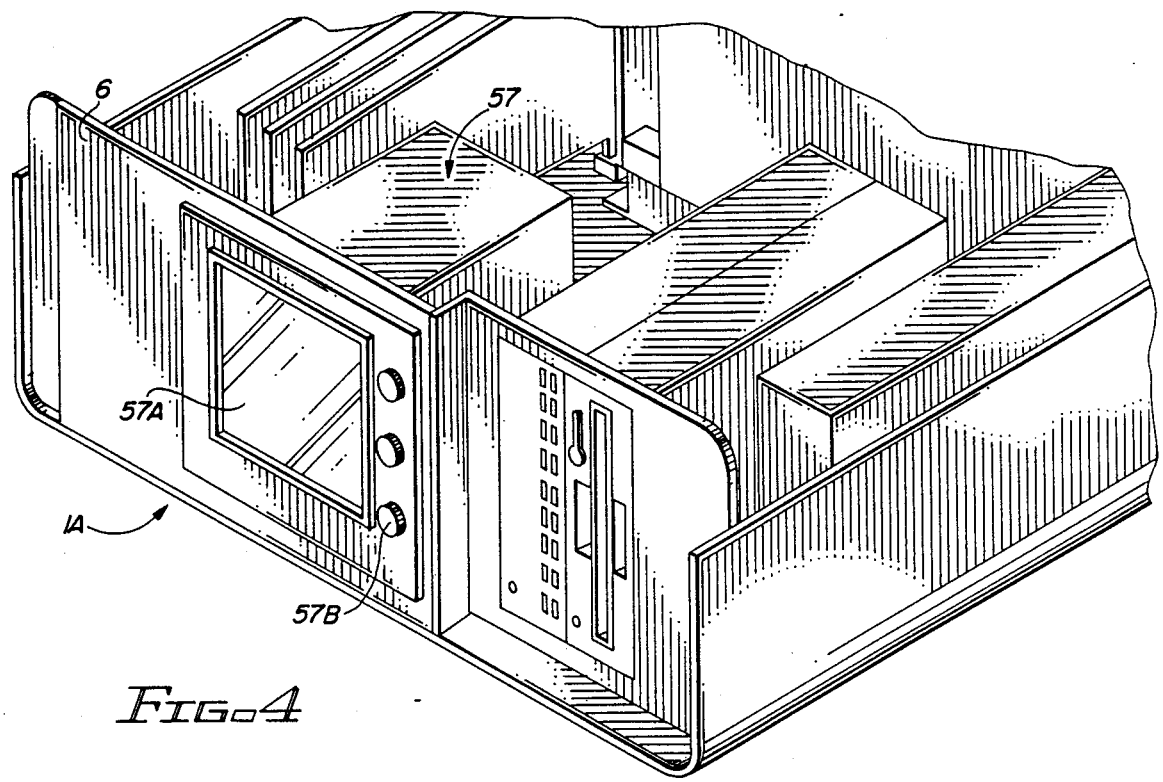
FIG. 4 is a partial front perspective view showing a CRT module installed within the housing with its screen accessible through a cutout in the front panel.

FIG. 4 shows another modification which an industrial PC user might make to the basic computer IA, by adding a module 57 including a graphic display 57A and various controls 57B. Front face plate 6 is removed and appropriate holes are drilled/cut in it to allow mounting of the module 57 and its associated controls. Connections between the modules 57 and its appropriate connectors of the mother board, plug-in printed circuit boards such as 35, 36, or 37, and/or printed circuit boards and/or equipment such as board 43 plugged into card cage 40 all are completely internal to adaptable housing 1. In many cases, one or more of the printed circuit boards 35, 36, and 37 might be unnecessary, allowing room for a larger unit than 57 to be installed on the inner surface of front face plate 6 or otherwise mounted within the space made available by elimination of one or more of printed circuit boards 35, 36, and 37. Such a unit could even be attached to the bottom surface of cover 28 and connected by appropriate ribbon cables or the like to connectors on the mother board 33 or printed circuit boards and/or equipment mounted in card cage 40.

FIG. 2A shows how various ribbon cable connectors such as 50 and 53 can be mounted on back face plate 15 after it has been removed and appropriate holes have been cut in it. Various conductors, for example in a ribbon cable such as 49, also can be routed out of adaptable housing 1 through openings and/or connectors (not shown) in L bracket 16 shown in FIG. 1. The computer 1A then can be connected to external equipment (not shown). Typically, such external equipment might be mounted in a standard 19-inch rack along with computer 2, which can be rack mounted by means of panel mount brackets such as 27 in FIG. 1 or rack mount slides. Alternately, conductors such as 49 might run to various sensors or transducers of a computer controlled manufacturing process or the like.

Figure 5:
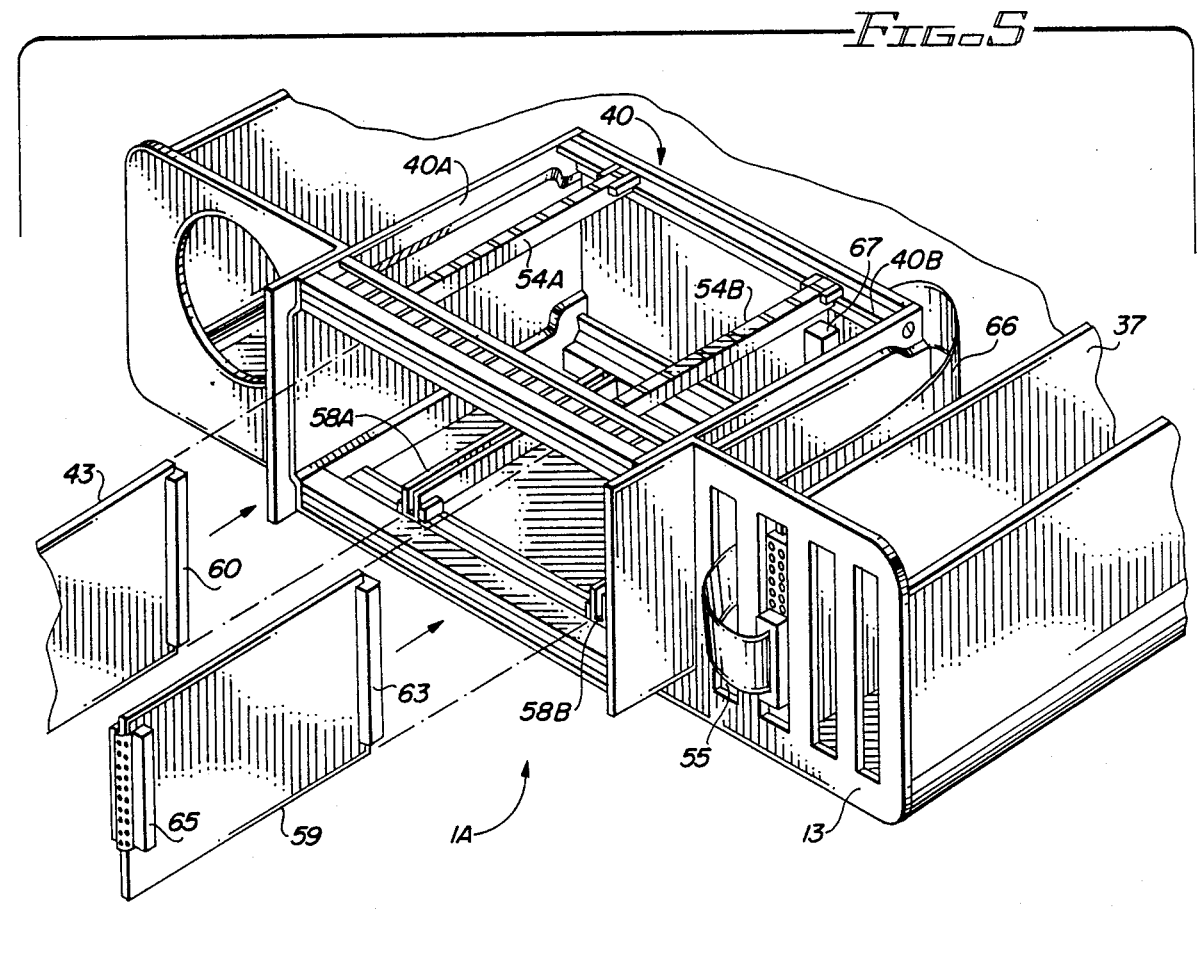
FIG. 5 is a partial perspective rear view of the housing showing details of the card cage thereof and insertion of printed circuit cards into the card cage and connection of a ribbon cable thereto.

FIG. 5 shows how printed circuit boards and/or "termination boards" such as 43 and 59 can be easily slid into slot pairs produced by card guides 54A and 58A and by 54B and 58B, respectively. Each such board has an end connector such as 60 and 63 (which may be a female Euroconnector) by means of which a mating connector such as 67 on a ribbon cable 66 can be connected to appropriate connectors on mother board 33 or one of the printed circuit boards such as 35, 36, or 37. Many printed circuit boards such as 35, 36, or 37 have a connector on their rear ends, in which case cable 66 could be passed through one of the slots 55 in section 13 of the rear panel assembly and connected through to the rear connector of such printed circuit board.

Once printed circuit boards such as 43 and 59 are in place in card cage 40, the rear face plate 15 can be bolted back onto the rear panel assembly 12, and various ribbon cables such as 39 and 44 in FIG. 2 can be connected to various connectors on the plug-in printed circuit boards 35, 36, and 37, mother board 33, and various connectors on the printed circuit boards 43, 59, etc. as shown. Such ribbon cables can pass through the gap 69 between rear plate 20A of card cage pan 20 and side plate 40B of card cage 40. Except for routing of cables through rear slots 55 from the inside to the outside of adaptable housing 1, such wiring can be kept entirely internal to adaptable housing 1.

Printed circuit boards such as 43 plugged into card cage 40 may be "terminal boards" containing sensitive analog circuitry for processing low level analog signals, for example from thermocouples and the like, for a data acquisition system. Such analog signal levels are very sensitive to electrical noise. The combination of the metal side panels 40A and 40B of card cage 40 and the bottom panel 20B and rear panel 20A of card cage pan 20, metal cover 28, and the metal rear face plate 15 provides excellent electrical shielding of such circuitry within card cage 40 from the effects of digital switching in the computer contained in mother board 33 and digital circuitry in printed circuit boards 35, 36, and 37, and from electrical noise being generated outside of adaptable housing 1.

FIG. 6 shows how the body 25A of disk mount box 25 is mounted on L-shaped disk drive bracket 24 and how lid 26 is bolted onto the top of body 25A to retain hard disk drive unit 46A therein in a shock-mounted fashion.

Bracket 24 includes mutually perpendicular plates 24A and 24B. A top flange 24C is perpendicular to plate 24A and has a slot 24D therein. Flange 24E is attached to the top edge of plate 24A and has a slot 24F in it. A flange 24G is perpendicular to plate 24A and rests on the surface of bottom panel 2A of adaptable housing 1. Flange 24H is attached to the bottom edge of plate 24B and is perpendicular to it. Embedded PEM nuts 24J facilitate screw attachment of bracket 24 to the upper surface of bottom panel 2A. The tab 24K has a PEM nut 24L embedded therein.

Disk drive support body 25A includes a "bottom" panel 25B, a side panel 25C, and a top panel 25D that is parallel to bottom panel 25B and is connected thereto by side panel 25C. Flanges 25E and 25F are attached to the opposite side edges of plates 25B and 25D and are perpendicular thereto. Hard disk drive unit 46A and floppy disk drive unit 46B (FIG. 2) are inserted side by side into disk drive bracket 25A, and cover 26 is attached to body 25A by means of screws (not shown) extending through clearance holes 26A into PEM nuts 25M.

Disk drive support body 25A is attached to bracket 24 by sliding two shoulder washers 73A and 73B into slots 24D and 24F, respectively. A screw extends through clearance hole 26B of lid 26 and clearance hole 25N of bracket 25A into a PEM nut 24L in tab 24K of bracket 24.

In accordance with the present invention, a plurality of openings such as 74A are punched in the side panel 25C of bracket 25A. Similar cutouts such as 75A and 75B are punched in lid 26. Grommets such as 76 are inserted into the larger portion of each of the openings 75A, 75B, etc. and slid sideways into the smaller parts of those grommet openings. Half height disk drive 46A has opposed rails with threaded holes such as 77A and 77B into which bosses such as 78 are screwed on both the side surfaces 79A and 79B of disk drive unit 46A. These bosses 78 extend snugly into the openings 80 of the grommets 76. Thus, for hard disk drive 46A, with four of the bosses 78 screwed into the appropriate threaded holes on side 79A and 79B, the two bosses on side 79B extend into the grommets supported in side panel 25C. The lid 26 then is lowered so that the bosses 78 screwed into the side 79A of disk drive 46A extend through the grommets supported in grommet holes 75A and 75B. When lid 26 is bolted to bracket 25A, a reliable shock mount is thereby provided for a hard drive 46A. Floppy disk drive 46B is similarly shock mounted.

Certain full heighth disk drives have mounting rails on only one surface, in which case bosses such as 78A are provided with a flange 78B that cannot pass through the hole 80 of grommet 76, so a one sided secure shock mount can be provided in bracket 25A.

While the invention has been described with reference to a particular embodiment thereof, those skilled in the art will be able to make the various modifications to the described embodiment of the invention without departing from the true spirit and scope of the invention. For example, it is not necessary that an entire IBM PC-AT computer be provided on mother board 33. In fact, a "passive" back plane could be provided in which one or more printed circuit boards such as 35, 36, or 37 which contain the operative electronics constituting a suitable computer. In fact, it would be possible to provide an entire computer on one or more printed circuit boards plugged into card cage 40, allowing a large amount of "floor space" within adaptive housing 1 wherein various electrical/mechanical devices could be installed. For example, a computerized gas analyzer might be installed within such available space.

What is claimed is:

1. An adaptable housing for a personal computer, comprising in combination;:
   (a) a metal bottom section, opposed metal first and second side panels, and a removable metal cover;
   (b) a removable metal front panel assembly attached to the bottom section and the first and second panels and having a plurality of openings therein;

(c) a metal front face plate attached to an outer surface of the front panel assembly and covering a first opening therein;
(d) a removable metal rear panel assembly attached to the bottom section and the first and second side panels and having a plurality of openings therein, and first and second mounting flanges extending rearward from opposed edges of a first opening therein;
(e) a metal rear face plate attached to the first and second mounting flanges of the rear panel assembly and partially covering the first opening therein;
(f) a computer board attached in fixed relation to the bottom section, and having thereon a first connector;
(g) a card cage supported above a portion of the bottom section adjacent to the rear panel assembly, having a slot, and carrying a first printed circuit board inserted into the slot, the first printed circuit board having a second connector;
(h) means for supporting the card cage;
(i) means or electrically coupling the first connector to the second connector.

2. The adaptable housing of claim 1 wherein the front face plate is attached by a plurality of screws to the front panel assembly and the rear face plate is attached by a plurality of screws to the first and second flanges.

3. The adaptable housing of claim 1 wherein the card cage has opposed vertical metal side panels and wherein the supporting means includes a metal horizontal bottom plate attached to the rear panel assembly and to the bottom section and a metal vertical panel attached to a forward edge of the horizontal bottom plate.

4. The adaptable housing of claim 3 wherein one of the metal side panels of the card cage and the vertical panel of the mounting means define an opening, and wherein the coupling means includes a conductor extending from the first connector through the opening to the second connector.

5. The adaptable housing of claim 4 wherein the opposed vertical metal side panels of the card cage, the horizontal bottom plate and the metal vertical panel provide RFI shielding between computer circuitry in the adaptable housing and analog circuitry in the card cage, and the rear face plate and the cover provide RFI shielding of the analog circuitry from noise outside of the adaptable housing.

6. The adaptable housing of claim 5 wherein the horizontal bottom plate of the mounting means and the rear face plate define a slot through which conductors connected to the printed circuit board in the card cage extend.

7. The adaptable housing of claim 6 wherein the conductors are included in a ribbon cable.

8. The adaptable housing of claim 1 including a second opening in the rear panel assembly and a vertical connector bracket located adjacent to the third opening, and a cable connected to a second printed circuit board plugged into the mother board, the cable extending through the second opening and a slot in the vertical connector bracket and connected to a third printed circuit board in the housing.

9. The adaptable housing of claim 1 including a disk drive bracket carrying a disk drive unit and exposing the disk drive unit through an opening in the front panel assembly.

10. The adaptable housing of claim 1 including a disk drive box supported adjacent to the front panel assembly by means of a L-shaped bracket attached to the bottom section.

11. The adaptable housing of claim 10 wherein a pair of opposed faces of the disk drive box include a plurality of enlarged openings for insertion of grommets and a plurality of smaller openings overlapping the enlarged openings for locking the grommets into selected positions, wherein bosses supported by the disk drive unit rest in apertures of the grommets to provide a shock mounting for the disk drive unit.

12. The adaptable housing of claim 11 wherein the disk drive box includes a cover having mounted therein a plurality of grommets, bosses in an opposite side of the disk drive unit extending through holes in the grommets mounted in the side rails of the disk drive unit.

13. The adaptable housing of claim 11 wherein bosses in the side rails of the disk drive unit include means for preventing them from being drawn through holes in the grommets, thereby securely mounting the disk drive unit in the disk drive box.

14. The adaptable housing of claim 1 including a microterminal with a keyboard and display attached to an inner surface of the front face panel, the keyboard and display being exposed through an opening in the front face plate.

15. The adaptable housing of claim 1 including a CRT unit supported inside the adaptable housing, a screen of the CRT being exposed through an opening in the front face plate.

16. The adaptable housing of claim 1 including a monitor attached to an upper surface of the cover.

17. The adaptable housing of claim 1 including a printer attached to an upper surface of the cover.

18. The adaptable housing of claim 1 including a computer-controlled/stimulated instrument and means for supporting the computer-controlled/stimulated instrument above the mother board inside the adaptable housing.

19. A method of embedding a personal computer into a larger product, comprising the steps of:
(a) providing an adaptable housing including
  i. a metal bottom section, opposed metal first and second side panels, and a removable metal cover,
  ii. a removable metal front panel assembly attached to the bottom section and the first and second side panels and having a plurality of openings therein,
  iii. a metal front face plate attached to an outer surface of the front panel assembly and covering a first opening therein,
  iv. a removable metal rear panel assembly attached to the bottom section and the first and second side panels and having a plurality of openings therein, and first and second mounting flanges extending rearward from opposed edges of a first opening therein,
  v. a metal rear face plate attached to the first and second mounting flanges of the rear panel assembly and partially covering the first opening therein,
  vi. a mother board attached to the bottom section in parallel relationship thereto, and having thereon a first connector,
  vii. a card cage supported above a portion of the mother board adjacent to the rear panel assembly,
  viii. means for supporting the card cage above a portion of the mother board;

(b) removing the front face plate and the rear face plate;
(c) forming openings in the front face plate and rear face plate and attaching various connectors, adapters, and/or display and control elements to the front face plate and rear face plate;
(d) inserting a printed circuit board through the second opening into a slot of the card cage, the printed circuit board having a second connector and a third connector;
(e) attaching a first cable between the second connector and an external piece of equipment controlling or controlled by the personal computer;
(f) attaching a second cable to the third connector, passing the second cable through a front slot in the cage card supporting means, and connecting the second cable to the first connector;
(g) replacing the front face plate and rear face plate and connecting various cables to the connectors, switches, and displays installed thereon;
(h) mounting the adaptable housing in a preselected relationship to the piece of equipment.

20. The method of claim 19 wherein step (h) includes mounting the adaptable housing and the piece of equipment on a single equipment rack.

21. The method of claim 19 including installing a microterminal including a keyboard and a display on the front face plate and connecting the microterminal to the computer board by means of a cable that is located entirely inside the adaptable housing.

22. The method of claim 19 including forming an opening in the front face plate, installing a CRT unit inside the adaptable housing and exposing a screen of the CRT unit through an opening in the front face plate.

23. A method of embedding a first piece of equipment controlling or controlled by a personal computer into the personal computer, the method comprising the steps of:
(a) providing an adaptable housing including
  i. a metal bottom section, opposed metal first and second side panels, and a removable metal cover,
  ii. a removable metal front panel assembly attached to the bottom section and the first and second side panels and having a plurality of openings therein,
  iii. a metal front face plate attached to an outer surface of the front panel assembly and covering a first opening therein,
  iv. a removable metal rear panel assembly attached to the bottom section and the first and second side panels and having a plurality of openings therein, and first and second mounting flanges extending rearward from opposed edges of a first opening therein,
  v. a metal rear face plate attached to the first and second mounting flanges of the rear panel assembly and partially covering the first opening therein,
  vi. a mother board attached in fixed relation to the bottom section and having thereon a first connector,
  vii. a card cage supported above a portion of the mother board adjacent to the rear panel assembly, and carrying a first printed circuit board inserted into a slot of the card cage and having a second connector and a third connector,
  viii. means for supporting the card cage above a portion of the mother board;

(b) removing the front face plate and the rear face plate;
(c) forming openings in the front face plate and rear face plate and attaching various connectors, adapters, and/or display and control elements to the front face plate and rear face plate;
(d) inserting a first printed circuit board through the second opening into a slot of the card cage;
(e) installing the first piece of equipment inside the adaptable housing;
(f) attaching a first cable between the second connector and an external second piece of equipment controlling or controlled by the computer;
(g) attaching a second cable to the third connector, passing the cable through a front slot in the card cage supporting means and connecting the second cable to a connector of the computer board;
(h) replacing the front face plate and rear face plate and connecting various cables to the connectors, switches, and displays installed thereon.

24. An adaptable housing for a personal computer, comprising in combination:
(a) a metal bottom section, opposed metal first and second side panels, a metal cover, and a metal front panel;
(b) a removable metal rear panel attached in fixed relation to the bottom section, the first and second side panels, and the cover;
(c) a first printed circuit board inside the adaptable housing having thereon a first connector;
(d) a card cage supported above a portion of the bottom section adjacent to the rear panel, the card cage having opposed vertical metal side panels attached to four parallel horizontal rails, a second printed circuit board being inserted into a slot of the card cage, the second printed circuit board having a second connector;
(e) means for supporting the card cage, the supporting means including a metal horizontal bottom plate attached to the rear panel assembly and to the bottom section and a metal vertical panel attached to a forward edge of the horizontal bottom plate, wherein one of the metal side panels of the card cage and the vertical panel of the mounting means define an opening, and wherein a conductor extends from the first connector through the opening to the second connector, whereby the opposed vertical metal side panels of the card cage, the horizontal bottom plate and the metal vertical panel provide RFI shielding between computer circuitry in the adaptable housing and circuitry in the second printed circuit board, and the rear face plate and the cover provide RFI shielding of the analog circuitry from noise outside of the adaptable housing.

25. An adaptable housing for a personal computer, comprising in combination:
(a) a metal bottom section, opposed metal first and second side panels, and a metal cover, a metal rear panel, and a metal front panel;
(b) a computer board attached in fixed relation to the bottom section, and having thereon a first connector;
(c) a disk drive bracket carrying a disk drive unit, wherein the disk drive bracket includes a pair of opposed faces each including a plurality of enlarged openings for insertion of grommets and a plurality of smaller openings overlapping the enlarged openings for locking the grommets into selected positions, wherein bosses supported by the disk drive unit are positioned in apertures of the grommets to provide a shock mounting for the disk drive unit.

26. The adaptable housing of claim 25 wherein the disk drive bracket includes a cover having mounted therein a plurality of grommets, bosses in an opposite side of the disk drive unit extending through holes in the grommets mounted in the side rails of the disk drive unit.

27. The adaptable housing of claim 25 wherein the bosses include means for preventing them from being drawn through holes in the grommets, thereby securely mounting the disk drive unit in the disk drive bracket.

28. A method of embedding a personal computer into a larger product, comprising the steps of:
 (a) providing a adaptable housing including
  i. a metal bottom section, opposed metal first and second side panels, a metal front panel, and a removable metal rear panel,
  ii. a card cage supported adjacent to the rear panel assembly,
  iii. a computer board outside of the card cage attached in fixed relation to the bottom section, and having thereon a first connector,
  iv. means for supporting the card cage;
 (b) removing the rear panel and cover;
 (c) inserting a printed circuit board through an opening uncovered by the removal of the rear panel into a slot of the card cage, the printed circuit board having a second connector and a third connector;
 (d) attaching a first cable between the third connector and an external piece of equipment;
 (e) attaching a second cable to the second connnector, passing the second cable through a front slot in the cage card supporting means, and connecting the second cable to the first connector;
 (f) replacing the rear panel;
 (g) mounting the adaptable housing in a preselected relationship to the piece of equipment.

29. A method of embedding a piece of equipment controlling or controlled by a personal computer into the personal computer, the method comprising the steps of:
 (a) providing an adaptable housing including
  i. a metal bottom section, opposed metal first and second side panels, a metal front panel, and a removable metal rear panel, and a metal cover,
  ii. a card cage supported adjacent to the rear panel assembly,
  iii. a computer board attached to the bottom section in parallel relationship thereto, and having thereon a first connector,
  iv. means for supporting the card cage;
 (b) removing the rear face plate;
 (c) inserting a printed circuit board through an opening uncovered by the removal of the rear panel into a slot of the card cage, the printed circuit board having a second connector;
 (d) installing the piece of equipment inside the adaptable housing;
 (e) connecting a first cable between the first connector, passing the first cable through a front slot in the card cage supporting means, and connecting the first cable to the second connector;
 (f) connecting a second cable to the computer board and the piece of equipment;
 (g) replacing the rear panel and cover.

* * * * *